US008362469B2

(12) United States Patent
Suh

(10) Patent No.: US 8,362,469 B2
(45) Date of Patent: Jan. 29, 2013

(54) ORGANIC LIGHT EMITTING DISPLAY APPARATUS AND METHOD OF MANUFACTURING ORGANIC LIGHT EMITTING DISPLAY APPARATUS

(75) Inventor: Min-Chul Suh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 12/854,124

(22) Filed: Aug. 10, 2010

(65) Prior Publication Data

US 2011/0031500 A1 Feb. 10, 2011

(30) Foreign Application Priority Data

Aug. 10, 2009 (KR) .................. 10-2009-0073519

(51) Int. Cl.
*H01L 35/24* (2006.01)
(52) U.S. Cl. ............... 257/40; 257/59; 257/72; 257/83; 257/98; 257/E51.001
(58) Field of Classification Search .......... 257/40, 257/59, 72, 83, 98
See application file for complete search history.

(56) References Cited

U.S. PATENT DOCUMENTS

| 2004/0185604 | A1 | 9/2004 | Park et al. | |
|---|---|---|---|---|
| 2004/0263441 | A1 | 12/2004 | Tanaka et al. | |
| 2006/0060870 | A1* | 3/2006 | Park et al. | 257/88 |
| 2006/0163570 | A1 | 7/2006 | Renn et al. | |
| 2007/0108899 | A1 | 5/2007 | Jung et al. | |
| 2008/0063949 | A1* | 3/2008 | Inoue | 430/5 |
| 2008/0073625 | A1* | 3/2008 | Araya et al. | 252/586 |
| 2009/0174630 | A1* | 7/2009 | Chan et al. | 345/76 |

FOREIGN PATENT DOCUMENTS

JP  2004-281399  10/2004

(Continued)

OTHER PUBLICATIONS

Korean Office Action dated Feb. 16, 2011 issued by the KIPO for corresponding Korean Patent Application No. 10-20090073519, 4 pages, citing KR 10-708750 B1.

(Continued)

*Primary Examiner* — Wai Sing Louie
(74) *Attorney, Agent, or Firm* — Christie, Parker & Hale, LLP

(57) ABSTRACT

An organic light emitting display apparatus capable of preventing or reducing an IR drop and a decrease in a contrast ratio, and a method of manufacturing the same. The organic light emitting display apparatus includes: a substrate; a plurality of thin film transistors on the substrate; a plurality of organic light emitting diodes, each of the organic light emitting diodes including: a pixel electrode electrically connected to a corresponding one of the thin film transistors, a portion of an opposite electrode, the opposite electrode being above the substrate and covering all of the substrate, and an intermediate layer between the pixel electrode and the opposite electrode and comprising at least an organic light emitting layer; an opposite electrode bus line between adjacent pixel electrodes of the organic light emitting diodes on the opposite electrode of the organic light emitting diodes; and a black matrix surrounding the opposite electrode bus line.

11 Claims, 3 Drawing Sheets

FOREIGN PATENT DOCUMENTS

| | | |
|---|---|---|
| JP | 2005-19211 | 1/2005 |
| JP | 2007-507114 | 3/2007 |
| JP | 2007-141844 | 6/2007 |
| JP | 2007-227129 | 9/2007 |
| JP | 2008-526469 | 7/2008 |
| JP | 2009-123696 | 6/2009 |
| KR | 10-2005-0034346 A | 4/2005 |
| KR | 10-2005-0034427 A | 4/2005 |
| KR | 10-2005-0048705 A | 5/2005 |
| KR | 10-0662557 B1 | 12/2006 |
| KR | 10-0708750 B1 | 4/2007 |
| WO | WO 2005/039814 A2 | 5/2005 |

OTHER PUBLICATIONS

EPO Extended Search Report dated Oct. 21, 2011, for corresponding European Patent Application No. 10251423.9, listing the cited references, 8 pages.

Hon, et al., "Direct writing technology—Advances and developments", CIRP Annals—Manufacturing Technology, vol. 57, (2008), pp. 601-620.

JPO Office Action dated Feb. 21, 2012, for corresponding Japanese Patent Application No. 2010-173752, 3 pages.

* cited by examiner

ORGANIC LIGHT EMITTING DISPLAY APPARATUS AND METHOD OF MANUFACTURING ORGANIC LIGHT EMITTING DISPLAY APPARATUS

CROSS-REFERENCE TO RELATED PATENT APPLICATION

This application claims priority to and the benefit of Korean Patent Application No. 10-2009-0073519, filed on Aug. 10, 2009, in the Korean Intellectual Property Office, the entire content of which is incorporated herein by reference.

BACKGROUND

1. Field

The present invention relates to an organic light emitting display apparatus and a method of manufacturing an organic light emitting display apparatus.

2. Description of the Related Art

An organic light emitting display apparatus produces light in accordance with the following principle: when an electrical signal is applied to a cathode and an anode, holes injected from the anode move to a light emitting layer and electrons injected from the cathode move to the light emitting layer. Then, in the light emitting layer, holes and electrons are combined to form excitons, and the excitons change from an excited state to a ground state, thereby producing light.

Organic light emitting display apparatuses are considered as next-generation flat panel display apparatuses due to their wide viewing angles, high contrast ratios, and/or high response speeds. Specifically, active matrix (AM) organic light emitting display apparatuses (in which controls of emissions of pixels and degrees of the emissions are performed by using thin film transistors) have been actively researched.

However, in AM organic light emitting display apparatuses, thin film transistors for controlling each pixel are disposed under an organic light emitting device, and thus if a bottom emission-type organic light emitting display apparatus (in which light is emitted only toward a bottom substrate) is used, light is emitted only through portions where thin film transistors are not disposed, and thus an aperture ratio is decreased. Moreover, since a plurality of thin film transistors are used to control pixels, performance of an organic light emitting display apparatus may be poor.

To solve these problems, a top emission-type organic light emitting display apparatus (in which light is emitted away from the substrate) has been developed. However, since a top electrode, that is, an opposite electrode, of a top emission-type organic light emitting display apparatus needs to be a transparent electrode, the top emission-type organic light emitting display apparatus is thin and may have high resistance, causing an IR drop.

To prevent or protect from the IR drop, a low-resistance and conductive bus line may be connected to the opposite electrode. However, when this structure is applied in top emission-type organic light emitting display apparatuses, a contrast ratio may be lowered.

SUMMARY

Aspects of embodiments of the present invention are directed toward an organic light emitting display apparatus capable of preventing or protecting from both an IR drop and a decrease in a contrast ratio, and a method of manufacturing an organic light emitting display apparatus.

Aspects of embodiments of the present invention are directed toward an organic light emitting display apparatus having a high contrast ratio capable of preventing or protecting from an IR drop and a method of manufacturing an organic light emitting display apparatus.

According to an embodiment of the present invention, there is provided an organic light emitting display apparatus including: a substrate; a plurality of thin film transistors on the substrate; a plurality of organic light emitting diodes, each of the organic light emitting diodes including: a pixel electrode electrically connected to a corresponding one of the thin film transistors, a portion of an opposite electrode, the opposite electrode being above the substrate and covering all of the substrate, and an intermediate layer between the pixel electrode and the opposite electrode and comprising at least an organic light emitting layer; an opposite electrode bus line between adjacent pixel electrodes of the organic light emitting diodes on the opposite electrode of the organic light emitting diodes; and a black matrix surrounding the opposite electrode bus line.

In one embodiment, the opposite electrode bus line has a stripe pattern.

In one embodiment, the opposite electrode bus line has a mesh pattern.

In one embodiment, the opposite electrode bus line includes a metal selected from the group consisting of silver, gold, copper, nickel, and combinations thereof.

The organic light emitting display apparatus may further include a planarization layer covering the thin film transistors, wherein the organic light emitting diodes are disposed on the planarization layer, and the pixel electrodes of the organic light emitting diodes are electrically connected to the thin film transistors through contact holes formed in the planarization layer.

In one embodiment, the light generated in the organic light emitting layers of the organic light emitting diodes is emitted out of the organic light emitting display apparatus through the opposite electrode of the organic light emitting diodes.

In one embodiment, the pixel electrodes of the organic light emitting diodes are anodes, and the opposite electrode of the organic light emitting diodes is a cathode.

The organic light emitting display apparatus may further include a pixel defining layer that has a set thickness and is formed around edge portions of the pixel electrodes, wherein the opposite electrode bus line and the black matrix are disposed on the pixel defining layer.

The organic light emitting display apparatus may further include an encapsulation structure formed on the opposite electrodes, wherein the organic light emitting diodes are sealed by the encapsulation structure.

The organic light emitting display apparatus may further include a buffer layer formed on the substrate.

According to an embodiment of the present invention, there is provided a method of manufacturing an organic light emitting display apparatus, the method including: forming a plurality of thin film transistors on a substrate; forming a plurality of organic light emitting diodes, each of the organic light emitting diodes including: a pixel electrode electrically connected to a corresponding one of the thin film transistors, an intermediate layer on the pixel electrode and comprising at least an organic light emitting layer, and a portion of an opposite electrode, the opposite electrode being above the substrate and covering all of the substrate; forming an opposite electrode bus line between adjacent pixel electrodes of the organic light emitting diodes on the opposite electrode of the organic light emitting diodes; and forming a black matrix surrounding the opposite electrode bus line.

In one embodiment, the opposite electrode bus line and the black matrix are formed by aerosol jet printing.

In one embodiment, the opposite electrode bus line has a stripe pattern.

In one embodiment, the opposite electrode bus line has a mesh pattern.

In one embodiment, the opposite electrode bus line includes a metal selected from the group consisting of silver, gold, copper, nickel, and combinations thereof.

The method may further include forming a planarization layer covering the thin film transistors, wherein the organic light emitting diodes are disposed on the planarization layer, and the pixel electrodes of the organic light emitting diodes are electrically connected to the thin film transistors through contact holes formed in the planarization layer.

In one embodiment, light generated in the organic light emitting layers of the organic light emitting diodes is emitted out of the organic light emitting display apparatus through the opposite electrode of the organic light emitting diodes.

In one embodiment, the pixel electrodes of the organic light emitting diodes are anodes, and the opposite electrodes of the organic light emitting diodes is a cathode.

The method may further include forming a pixel defining layer that has a set thickness and is formed around edge portions of the pixel electrodes, wherein the opposite electrode bus line and the black matrix are disposed on the pixel defining layer.

The method may further include an encapsulation structure formed on the opposite electrodes, wherein the organic light emitting diodes are sealed by the encapsulation structure.

The method may further include forming a buffer layer on the substrate.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
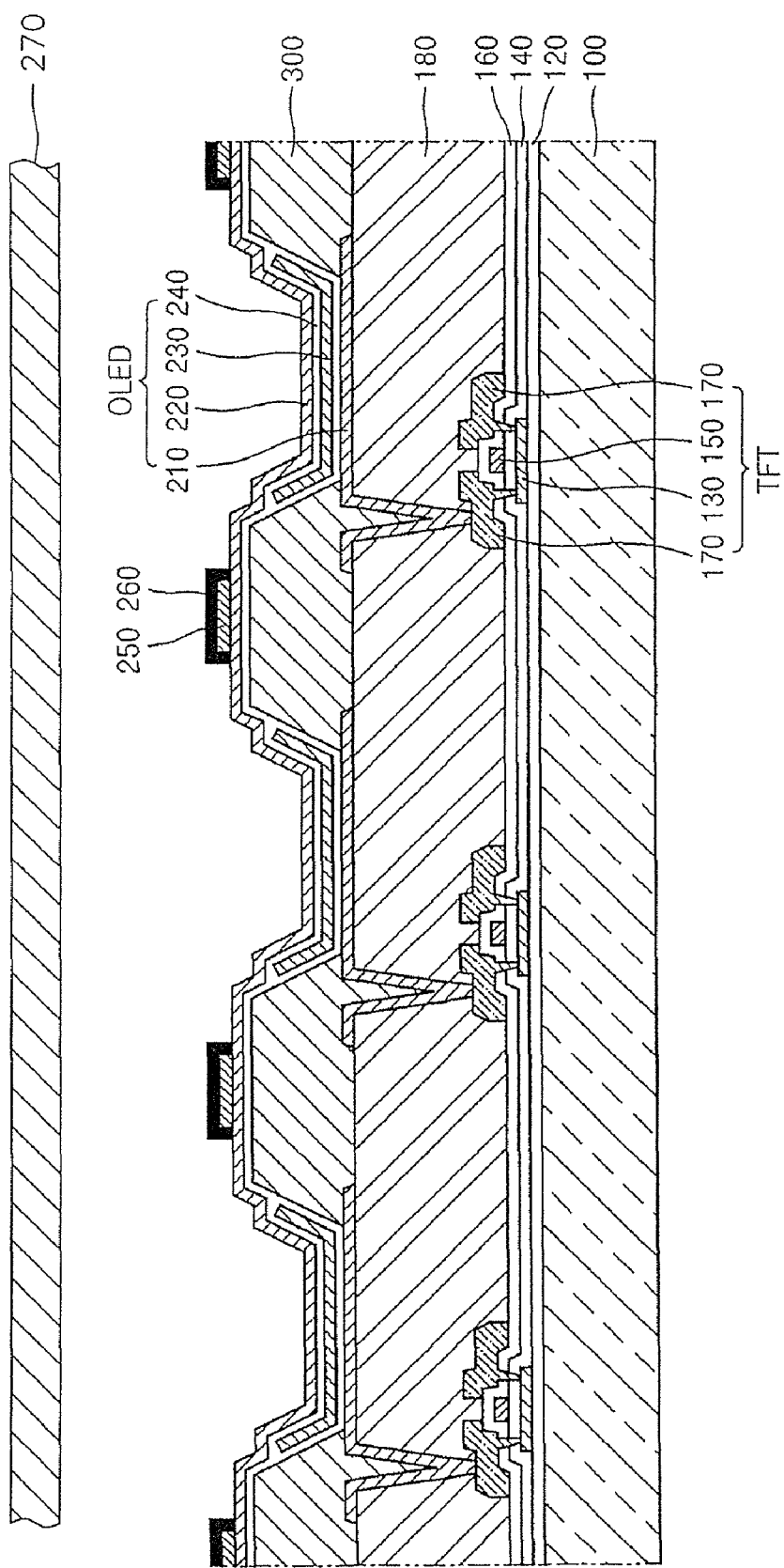
FIG. 1 is a schematic cross-sectional view of an organic light emitting display apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 2:
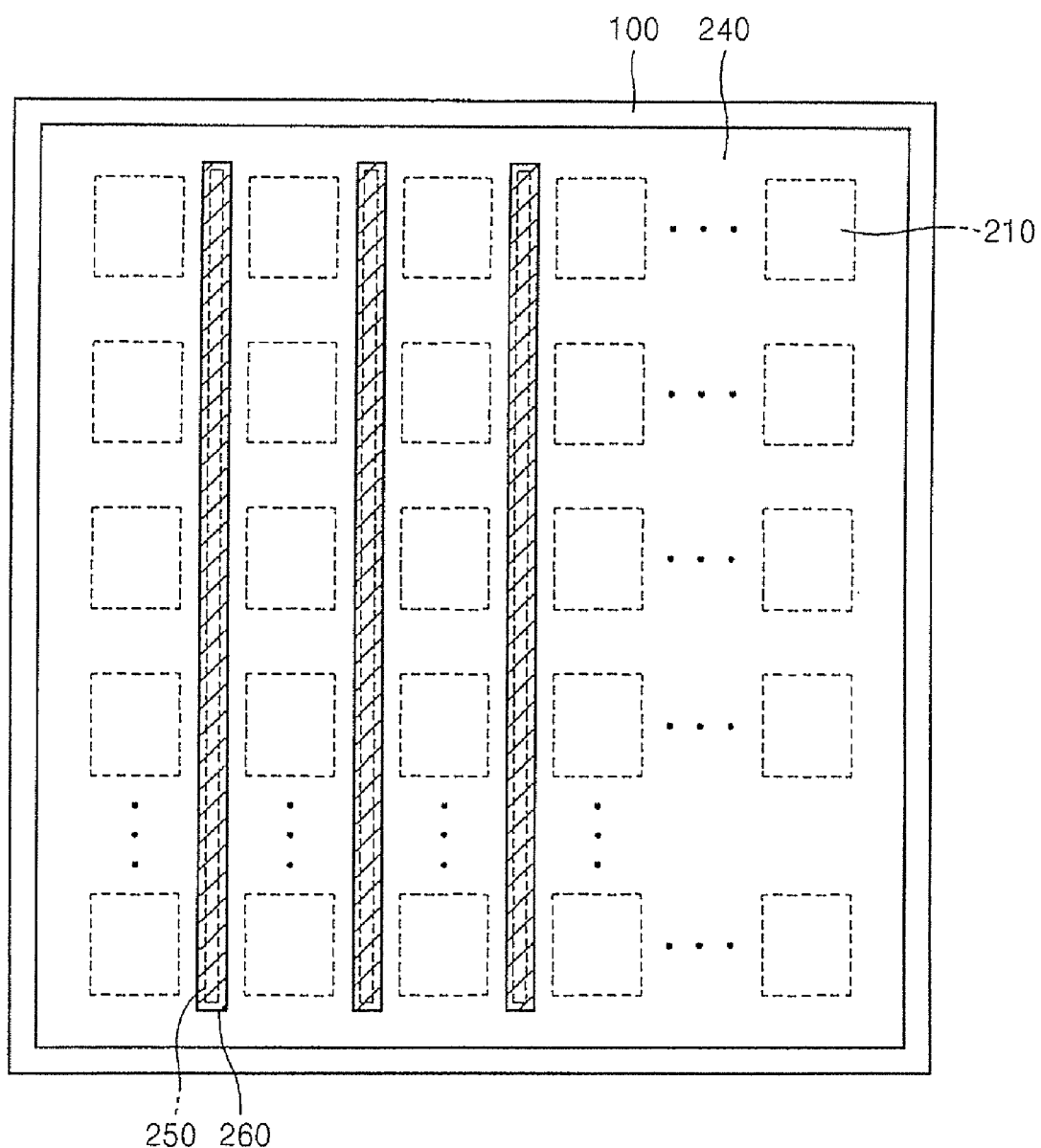
FIG. 2 is a schematic plan view of the organic light emitting display apparatus of FIG. 1.

FIG. 1 is a schematic sectional view of an organic light emitting display apparatus according to an embodiment of the present invention, and FIG. 2 is a schematic plan view of the organic light emitting display apparatus of FIG. 1.

Referring to FIG. 1, a plurality of thin film transistors (TFTs) are disposed on a substrate 100, and an organic light emitting diode (OLED) is disposed above each of the TFTs. Each of the OLEDs include a pixel electrode 210 electrically connected to a corresponding TFT; a portion of an opposite electrode 220, the opposite electrode 220 being disposed above the substrate 100 and covering all of the substrate 100; and an intermediate layer 240 that is disposed between the pixel electrode 210 and the opposite electrode 220 and that includes at least an organic light emitting layer 230.

The substrate 100 may include or be composed of glass. However, the substrate 100 of the organic light emitting display apparatus of the present embodiment is not limited thereto.

The TFTs are disposed on the substrate 100. Each of the TFTs includes a gate electrode 150, source and drain electrodes 170, a semiconductor layer 130, a gate insulating layer 140, and an interlayer insulating layer 160. However, the structures of the TFTs are not limited thereto. For example, the TFTs may be organic TFTs in which the semiconductor layer 130 includes an organic material, or silicon TFTs in which the semiconductor layer 130 includes silicon. If necessary, a buffer layer 120 including silicon oxide and/or silicon nitride may be further disposed between the TFTs and the substrate 100.

Each of the OLEDs includes the pixel electrode 210, the opposite electrode 220 facing the pixel electrode 210, and the intermediate layer 240, which is interposed between the pixel electrode 210 and the opposite electrode 220 and further includes at least one organic layer. The intermediate layer 240 includes at least the organic light emitting layer 230, and may include a plurality of other suitable layers. These other suitable layers will be described later in more detail.

The pixel electrode 210 functions as an anode, and the opposite electrode 220 functions as a cathode. In another embodiment, the pixel electrode 210 functions as a cathode, and the opposite electrode 220 functions as an anode.

The pixel electrode 210 may be a transparent electrode or a reflective electrode. When the pixel electrode 210 is a transparent electrode, the pixel electrode 210 may include or be composed of ITO, IZO, ZnO, and/or $In_2O_3$. When the pixel electrode 210 is a reflective electrode, the pixel electrode 210 may include or be composed of: a reflective film including Ag, Mg, Al, Pt, Pd, Au, Ni, Nd, Ir, Cr, or a mixture thereof; and a transparent film including ITO, IZO, ZnO or $In_2O_3$, wherein the transparent film is formed on the reflective film.

The opposite electrode 220 may also be a transparent electrode or a reflective electrode. When the opposite electrode 220 is a transparent electrode, Li, Ca, LiF/Ca, LiF/Al, Al, Mg, or a mixture thereof is deposited to form a reflective film, and then an auxiliary electrode or a bus electrode may be formed on the reflective film using a transparent electrode forming material such as ITO, IZO, ZnO or $In_2O_3$, wherein the reflective film is disposed closer to the intermediate layer 240 (between the pixel electrode 210 and the opposite electrode 220) than the auxiliary electrode and the bus electrode. When the opposite electrode 220 is a reflective electrode, Li, Ca, LiF/Ca, LiF/Al, Al, Mg, or a mixture thereof is deposited to form a reflective film.

In addition, a pixel defining layer (PDL) 300 having a set or predetermined thickness is formed around the pixel electrode 210, covering edges (and/or edge portions) of the pixel electrode 210. The PDL 300 defines a light emitting region, and also widens the interval between the edges of the pixel electrode 210 and the opposite electrode 220 so as to prevent (or protect from) the generation of a strong electric field on the edges of the pixel electrode 210, thereby preventing (or protecting from) an occurrence of a short-circuit between the pixel electrode 210 and the opposite electrode 220.

The intermediate layer 240 interposed between the pixel electrode 210 and the opposite electrode 220 may include the organic light emitting layer 230 and at least one other suitable organic layer.

The organic light emitting layer 230 emits light by being electrically driven between the pixel electrode 210 and the opposite electrode 220. The organic light emitting layer 230 may include a low-molecular weight organic material and/or a polymer organic material.

When the organic light emitting layer 230 includes a low-molecular weight organic material, the intermediate layer 240 may include, for example, a hole transport layer (HTL) and a hole injection layer (HIL) sequentially formed in a direction from the organic light emitting layer 230 to the pixel electrode 210, and an electron transport layer (ETL) and an electron injection layer (EIL) sequentially formed in a direction from the organic light emitting layer 230 to the opposite electrode 220. In this regard, each layer may have a single-layered structure or a multi-layered structure. Examples of a low-molecular weight organic material include copper phthalocyanine (CuPc), N,N'-Di naphthalene-1-yl-N,N'-diphenyl-benzidine (NPB), and tris-8-hydroxyquinoline aluminum (Alq3). These low-molecular weight organic materials may be vacuum deposited using a mask.

In addition, when the organic light emitting layer 230 includes a polymer organic material, the intermediate layer 240 may include the HTL and the organic light emitting layer 230, wherein the HTL may include poly-2,4-ethylene-dihydroxy thiophene (PEDOT) or polyaniline (PANI). Examples of a polymer organic material include poly-phenylenevinylene (PPV) and polyfluorene.

The OLEDs are electrically connected to corresponding TFTs disposed under the OLEDs. When a planarization layer 180 covering the TFTs is formed, the OLEDs may be disposed on the planarization layer 180, and the pixel electrodes 210 of the OLEDs are electrically connected to the corresponding TFTs through a contact hole formed in the planarization layer 180.

Also, as shown in FIG. 1, the OLEDs are formed above the substrate 100, and the organic light emitting display apparatus may further include an encapsulation structure (and/or moisture absorbent structure) 270 on the opposite electrode 220 and for protecting the organic light emitting layer 230 from external moisture and/or oxygen and/or for sealing the OLEDs.

In this structure, an opposite electrode bus line 250 may be further formed on the opposite electrode 220 of the OLEDs. Referring to FIG. 2, the opposite electrode bus line 250 is disposed between the pixel electrodes 210 of adjacent OLEDs. The opposite electrode bus line 250 may be formed using various suitable methods such as an aerosol jet printing method.

The opposite electrode 220 is formed above the substrate 100 and completely covers the substrate 100, that is, entirely covers a display unit. However, when electrons or holes are injected to the organic light emitting layer 230, an IR drop occurs due to resistance of the opposite electrode 220. As a result, when signals are applied such that OLEDs are to emit light having the same luminosity, light having different luminosities may be emitted according to the positions of the OLEDs. In particular, recently, as the number of electrical devices, such as TFTs, controlling operation of respective sub-pixels of an active matrix (AM) organic light emitting display apparatus increases, a top emission-type organic light emitting display apparatus, in which light generated in the organic light emitting layer 230 of the OLED is emitted through the opposite electrode 220, and not through substrate 100, has been developed. In the top emission-type organic light emitting display apparatus, however, the opposite electrode 220, through which light penetrates, needs to be transparent and thin. However, the thinner the opposite electrode 220 is, the higher resistance the opposite electrode 220 has, and thus an IR drop effect is more noticeable.

Thus, an organic light emitting display apparatus according to an embodiment of the present invention is designed to prevent or protect from an IR drop due to the opposite electrode 220 by forming the opposite electrode bus line 250 on the opposite electrode 220, wherein the opposite electrode bus line 250 includes a conductive material. The opposite electrode bus line 250 may be formed in a non-light emitting area so as to not block light that is emitted through the opposite electrode 220 towards a top surface of the organic light emitting display apparatus. For example, as illustrated in FIG. 1, the opposite electrode bus line 250 may be disposed between the pixel electrodes 210 of adjacent OLEDs. Although the opposite electrode bus line 250 is formed in a stripe pattern in FIG. 2, the opposite electrode bus line 250 may be formed in various other suitable patterns. For example, the opposite electrode bus line 250 may also be formed in a mesh pattern, such as in an organic light emitting display apparatus according to another embodiment of the present invention as illustrated in FIG. 3.

Figure 3:
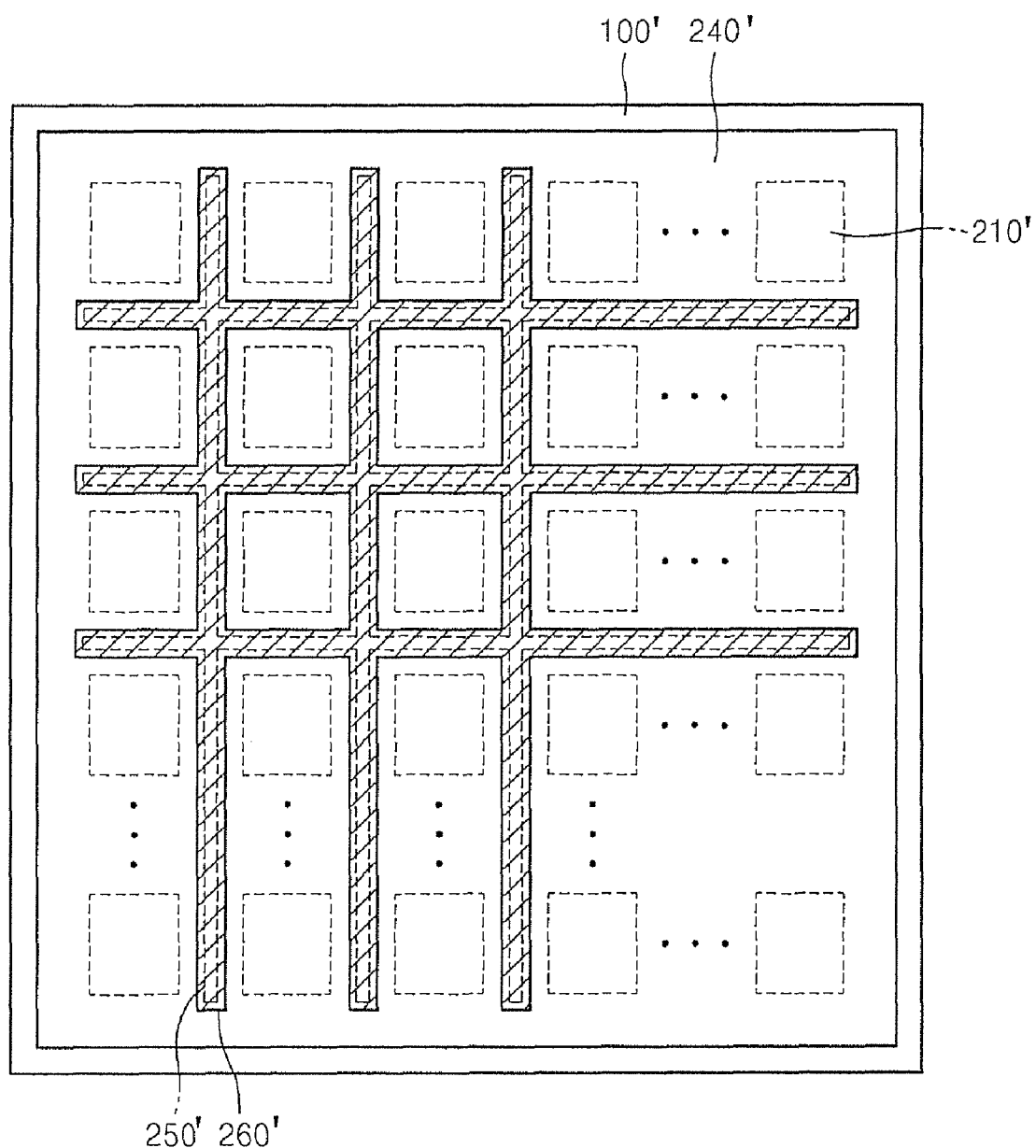
FIG. 3 is a schematic plan view of an organic light emitting display apparatus according to another embodiment of the present invention.

Here, in FIG. 3, the organic light emitting display apparatus includes a plurality of thin film transistors (TFTs) disposed on a substrate 100', and an organic light emitting diode (OLED) disposed above each of the TFTs. Each of the OLEDs include a pixel electrode 210' electrically connected to a corresponding TFT; a portion of an opposite electrode, the opposite electrode being disposed above the substrate 100' and covering all of the substrate 100'; and an intermediate layer 240' that is disposed between the pixel electrode 210' and the opposite electrode and that includes at least an organic light emitting layer. In addition, as shown in FIG. 3, an opposite electrode bus line 250' in a mesh pattern is further formed on the opposite electrode of the OLEDs.

Referring back to FIGS. 1 and 2, the opposite electrode bus line 250 may include silver, gold, copper, and/or nickel, i.e., may include at least one metal selected from the group consisting of silver, gold, copper, and nickel.

However, even if the IR drop of the opposite electrode 220 is prevented or reduced by forming the opposite electrode bus line 250, a high reflection rate of the opposite electrode bus line 250 may lead to a lower contrast ratio of the organic light emitting display apparatus.

Thus, in one embodiment, the organic light emitting display apparatus further includes a black matrix 260 surrounding and/or covering the opposite electrode bus line 250 to lower the reflection rate of the opposite electrode bus line 250, thereby preventing or reducing a decrease in the contrast ratio of the organic light emitting display apparatus. The black matrix 260 may be formed in a non-light emitting area so as to not block light that is emitted through the opposite electrode 220 towards a top surface of the organic light emitting display apparatus. For example, as illustrated in FIG. 1, the black matrix 260 may be disposed between the pixel electrodes 210 of adjacent OLEDs, and surrounds and/or covers the opposite electrode bus line 250. Although the black matrix 260 is formed in a stripe pattern in FIG. 2, the black matrix 260 may be formed in various other suitable patterns. For example, a black matrix 260' formed in a mesh pattern is shown in the organic light emitting display apparatus according to the embodiment of the present invention illustrated in FIG. 3.

Referring back to FIGS. 1 and 2, the black matrix 260 may include carbon black particles and/or graphite.

In addition, the opposite electrode bus line 250 and the black matrix 260 may be formed in a non-light emitting area as described above. The opposite electrode bus line 250 and the black matrix 260 may be formed using various suitable methods such as a photography method, an inject-printing method, or an off-set printing method. In addition, the opposite electrode bus line 250 and the black matrix 260 may also be formed by aerosol jet printing. In the aerosol jet printing, materials for forming the opposite electrode bus line 250 and the black matrix 260 are prepared in the form of an aerosol in which a solid and a liquid are mixed with gas, and the prepared aerosols are sprayed.

If blanket deposition is performed followed by wet etching, the organic light emitting layer 230 and the intermediate layer 240, which are disposed under the opposite electrode bus line 250 and the black matrix 260 and include an organic material, may be damaged. In addition, if deposition is performed using a mask, the mask needs to be fixed, and if the mask and the substrate 100 are misaligned, all the pixels formed in the entire display region may be defective. However, if the opposite electrode bus line 250 and the black matrix 260 are formed by aerosol jet printing, even if an aerosol jet deposition head, and the substrate 100 are temporarily misaligned; only some pixels may be defective and the quality of the organic light emitting display apparatus may be comparatively more reliable. In addition, since the aerosol jet printing is a non-contact process, the organic light emitting layer 230 and the intermediate layer 240 may be less damaged. Furthermore, a line-width is more freely controlled and thus, the opposite electrode bus line 250 and the black matrix 260 may be formed to have a fine line-width.

According to the embodiments of the present invention, the embodiments of the present invention have the following effects.

First, an IR drop of an opposite electrode may be prevented or reduced by forming an opposite electrode bus line between adjacent pixel electrodes on the opposite electrode.

Second, the IR drop of the opposite electrode and a decrease in a contrast ratio may be simultaneously or concurrently prevented or reduced by surrounding and/or covering the opposite electrode bus line with a black matrix.

Third, the quality of an organic light emitting display apparatus may be more reliable by forming an opposite electrode bus line and a black matrix each having a fine line-width by aerosol jet printing.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display apparatus comprising:
   a substrate;
   a plurality of thin film transistors on the substrate;
   a plurality of organic light emitting diodes, each of the organic light emitting diodes comprising:
      a pixel electrode electrically connected to a corresponding one of the thin film transistors,
      a portion of an opposite electrode, the opposite electrode being above the substrate and covering all of the substrate, and
      an intermediate layer between the pixel electrode and the opposite electrode and comprising at least an organic light emitting layer;
   an opposite electrode bus line between adjacent pixel electrodes of the organic light emitting diodes on the opposite electrode of the organic light emitting diodes; and
   a black matrix covering more than one side of the opposite electrode bus line.

2. The organic light emitting display apparatus of claim 1, wherein the opposite electrode bus line has a stripe pattern.

3. The organic light emitting display apparatus of claim 1, wherein the opposite electrode bus line has a mesh pattern.

4. The organic light emitting display apparatus of claim 1, wherein the opposite electrode bus line comprises a metal selected from the group consisting of silver, gold, copper, nickel, and combinations thereof.

5. The organic light emitting display apparatus of claim 1, further comprising a planarization layer covering the thin film transistors, wherein the organic light emitting diodes are on the planarization layer, and the pixel electrodes of the organic light emitting diodes are electrically connected to the thin film transistors through contact holes formed in the planarization layer.

6. The organic light emitting display apparatus of claim 1, wherein light generated in the organic light emitting layers of the organic light emitting diodes is emitted out of the organic light emitting display apparatus through the opposite electrode of the organic light emitting diodes.

7. The organic light emitting display apparatus of claim 1, wherein the pixel electrodes of the organic light emitting diodes are anodes, and the opposite electrode of the organic light emitting diodes is a cathode.

8. The organic light emitting display apparatus of claim 1, further comprising a pixel defining layer having a set thickness, the pixel defining layer being around edge portions of the pixel electrodes, wherein the opposite electrode bus line and the black matrix are on the pixel defining layer.

9. The organic light emitting display apparatus of claim 1, further comprising an encapsulation structure on the opposite electrode, wherein the organic light emitting diodes are sealed by the encapsulation structure.

10. The organic light emitting display apparatus of claim 1, further comprising a buffer layer on the substrate.

11. An organic light emitting display apparatus comprising:
    a substrate;
    a plurality of thin film transistors on the substrate;
    a plurality of organic light emitting diodes, each of the organic light emitting diodes comprising:
       a pixel electrode electrically connected to a corresponding one of the thin film transistors,
       a portion of an opposite electrode, the opposite electrode being above the substrate and covering all of the substrate, and
       an intermediate layer between the pixel electrode and the opposite electrode and comprising at least an organic light emitting layer;
    a plurality of opposite electrode bus lines spaced apart from each other, each opposite electrode bus line being between adjacent pixel electrodes of the organic light emitting diodes on the opposite electrode of the organic light emitting diodes; and
    a plurality of black matrices spaced apart from each other, wherein each of the black matrices covers a corresponding one of the opposite electrode bus lines.

* * * * *